United States Patent
Datta et al.

(10) Patent No.: US 9,678,154 B2
(45) Date of Patent: Jun. 13, 2017

(54) CIRCUIT TECHNIQUES FOR EFFICIENT SCAN HOLD PATH DESIGN

(71) Applicant: QUALCOMM Incorporated, San Diego, CA (US)

(72) Inventors: Animesh Datta, San Diego, CA (US); Qi Ye, San Diego, CA (US); Steven James Dillen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 307 days.

(21) Appl. No.: 14/528,554

(22) Filed: Oct. 30, 2014

(65) Prior Publication Data

US 2016/0124043 A1    May 5, 2016

(51) Int. Cl.
| | | |
|---|---|---|
| G01R 31/28 | (2006.01) | |
| G01R 31/317 | (2006.01) | |
| G01R 31/3177 | (2006.01) | |
| H03K 5/133 | (2014.01) | |
| H03K 5/134 | (2014.01) | |
| G11C 7/10 | (2006.01) | |
| G11C 29/32 | (2006.01) | |
| G01R 31/3185 | (2006.01) | |

(52) U.S. Cl.
CPC ... G01R 31/31725 (2013.01); G01R 31/3177 (2013.01); G01R 31/31727 (2013.01); G11C 7/1057 (2013.01); G11C 7/1066 (2013.01); G11C 29/32 (2013.01); H03K 5/133 (2013.01); H03K 5/134 (2014.07); *G01R 31/318541* (2013.01); *G11C 2029/3202* (2013.01)

(58) Field of Classification Search
CPC ........ G01R 31/31725; G01R 31/31727; G01R 31/3177; G01R 31/318541; G01R 31/318536; G01R 31/318533; G11C 7/105; G11C 7/1066; G11C 29/32; G11C 29/3202; H03K 5/133; H03K 5/134; H03K 2005/00019; H03K 2005/00032
See application file for complete search history.

(56) References Cited

U.S. PATENT DOCUMENTS

| | | | |
|---|---|---|---|
| 5,512,854 A | * | 4/1996 | Park ..................... G11C 7/1057 326/85 |
| 5,973,987 A | | 10/1999 | Akai et al. |
| 6,052,013 A | | 4/2000 | Kuo |
| (Continued) | | | |

FOREIGN PATENT DOCUMENTS

EP    1340991 A2    9/2003

OTHER PUBLICATIONS

International Search Report and Written Opinion—PCT/US2015/053878—ISA/EPO—Apr. 20, 2016.

(Continued)

*Primary Examiner* — Christine Tu
(74) *Attorney, Agent, or Firm* — Loza & Loza, LLP

(57) ABSTRACT

In one embodiment, a method for signal delay in a scan path comprises, in a scan mode, delaying a scan signal in the scan path by propagating the scan signal through a plurality of delay devices coupled in series, wherein a first one of the delay devices is powered by a first voltage, a second one of the delay devices is powered by a second voltage, and the second voltage is greater than the first voltage. The method also comprises, in a functional mode, disabling the delay devices.

36 Claims, 9 Drawing Sheets

(56) References Cited

U.S. PATENT DOCUMENTS

| | | | |
|---|---|---|---|
| 6,166,572 A * | 12/2000 | Yamaoka | H03L 7/07 327/149 |
| 6,384,656 B1 | 5/2002 | Kuo et al. | |
| 6,412,098 B1 | 6/2002 | Jin | |
| 6,515,521 B2 | 2/2003 | Kono et al. | |
| 7,319,343 B2 | 1/2008 | Bhunia et al. | |
| 2005/0218953 A1 * | 10/2005 | Slawecki | H03K 5/133 327/276 |
| 2007/0280054 A1 | 12/2007 | Watanabe | |
| 2012/0072793 A1 | 3/2012 | Rao et al. | |
| 2014/0035645 A1 | 2/2014 | Narayanan et al. | |

OTHER PUBLICATIONS

Partial International Search Report—PCT/US2015/053878—ISA/EPO—Jul. 1, 2016.

Saint-Laurent M., et al., "A 28nm DSP Powered by an on-chip LDO for High-Performance and Energy-Efficient Mobile Applications", IEEE International Solid-State Circuits Conference Digest of Technical Papers (ISSCC), IEEE, Feb. 2014, pp. 176-177.

Warnock J., et al., "5.5GHz System Z Microprocessor and MultiChip Module", IEEE International Solid-State Circuits Conference Digest of Technical Papers (ISSCC), 2013, pp. 46-47.

Warnock J., et al., "Circuit Design Techniques for a First-Generation Cell Broadband Engine Processor", IEEE Journal of Solid-State Circuits, IEEE, vol. 41, No. 8, 2006, pp. 1692-1706.

* cited by examiner

CIRCUIT TECHNIQUES FOR EFFICIENT SCAN HOLD PATH DESIGN

BACKGROUND

Field

Aspects of the present disclosure relate generally to latches, and more particularly, to efficient scan hold paths for latches.

Background

Latches may be used in a system to capture (latch) data values from one or more data signals for processing by various components of the system. The system may include scan circuitry to verify that the latches function correctly during a test mode (scan mode). To do this, the scan circuitry receives a scan signal having a known test pattern, and scans the scan signal through the latches. After the scan signal has been scanned through the latches, the output scan signal is compared with an expected output scan signal based on the known test pattern to determine whether the latches are functioning correctly.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to a first aspect, a method for signal delay in a scan path is described herein. The method comprises, in a scan mode, delaying a scan signal in the scan path by propagating the scan signal through a plurality of delay devices coupled in series, wherein a first one of the delay devices is powered by a first voltage, a second one of the delay devices is powered by a second voltage, and the second voltage is greater than the first voltage. The method also comprises, in a functional mode, disabling the delay devices.

A second aspect relates to an apparatus for signal delay in a scan path. The apparatus comprises means for, in a scan mode, delaying a scan signal in the scan path by propagating the scan signal through a plurality of delay devices coupled in series, wherein a first one of the delay devices is powered by a first voltage, a second one of the delay devices is powered by a second voltage, and the second voltage is greater than the first voltage. The apparatus also comprises means for, in a functional mode, disabling the delay devices.

A third aspect relates to a delay circuit. The delay circuit comprises a first delay device having a first input, a second input, and an output, wherein the first delay device is powered by a first voltage. The delay circuit also comprises a second delay device having an input coupled to the output of the first delay device, and an output, wherein the second device is powered by the first voltage. The delay circuit further comprises a third delay device having an input coupled to the output of the second delay device, and an output, wherein the third delay device is powered by a second voltage. The second voltage is greater than the first voltage. The first, second and third delay devices are configured to propagate a scan signal from the first input of the first delay device to the output of the third delay device if a first logic state is input to the second input of the first delay device, and to block a signal from propagating through the first, second and third delay devices if a second logic state is input to the second input of the first delay device.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
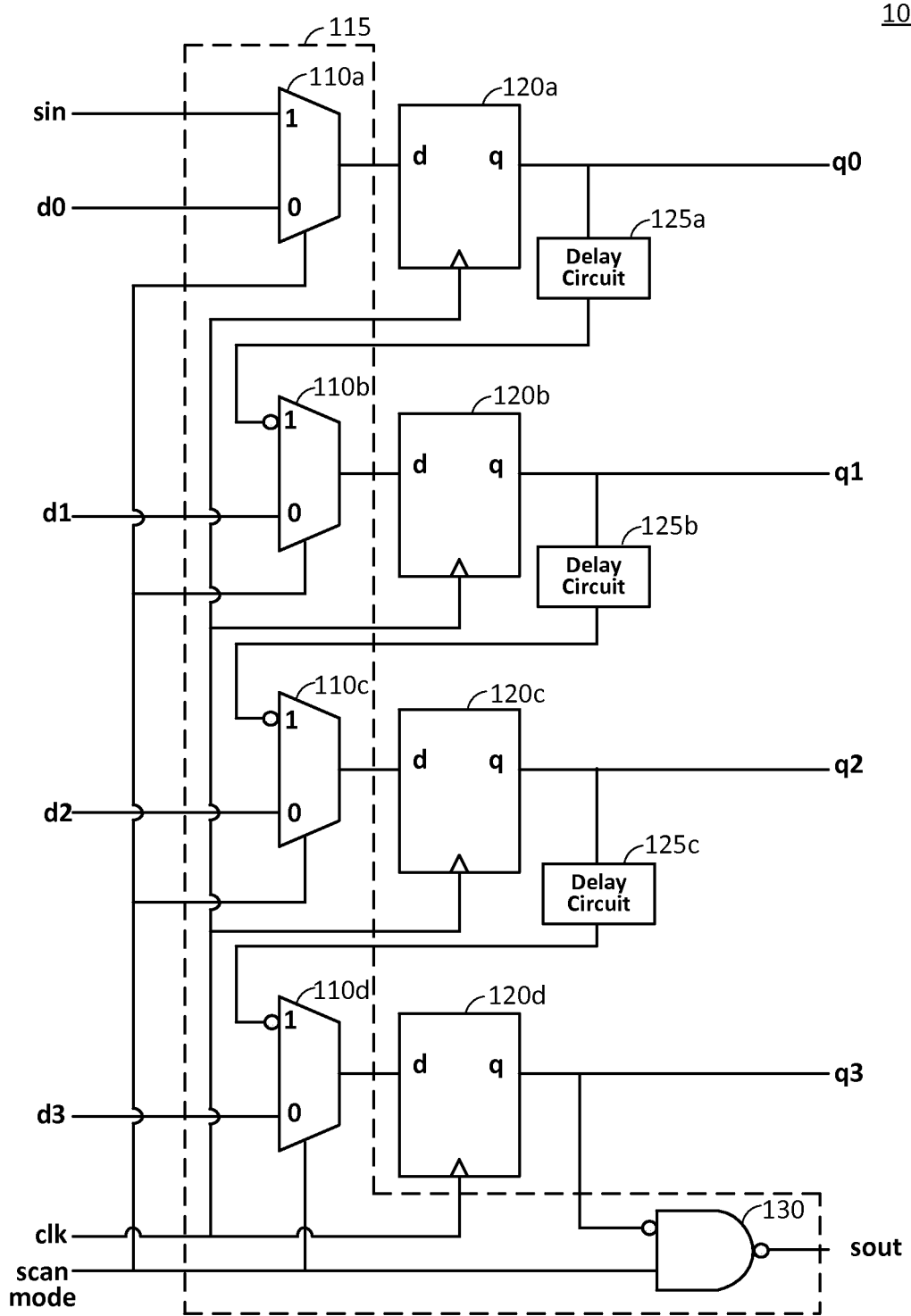
FIG. 1 shows an example of a multi-bit register comprising scan circuitry.

FIG. 1 shows an example of a scannable multi-bit register 100. The multi-bit register 100 can operate in a functional mode or a scan mode. The multi-bit register 100 is operated in the scan mode during testing to test the functionality of the register 100, as discussed further below.

The multi-bit register 100 comprises a first latch 120a, a second latch 120b, a third latch 120c, a fourth latch 120d, and scan circuitry 115. Each latch 120a-120d may comprise a D flip-flop, a pulsed latch, or another type of latch. FIG. 1 shows an example in which each latch 120a-120d comprises a D flip-flop. The scan circuitry 115 is used to operate the register 100 in the scan mode during testing, as discussed further below. The scan circuitry 115 comprises a first scan multiplexer 110a, a second scan multiplexer 110b, a third scan multiplexer 110c, a fourth scan multiplexer 110d, and a NAND gate 130. The output of each scan multiplexer 110a-110d is coupled to the input (labeled "d") of a respective one of the latches 120a-120d.

In the functional mode, the multi-bit register 100 receives a plurality of data signals d0-d3 in parallel. Each scan multiplexer 110a-110d receives one of the parallel data signals d0-d3 at a data input (labeled "0" in FIG. 1), and passes the respective data signal d0-d3 to the input of the respective latch 120a-120d. Each latch 120a-120d captures a data value (e.g., a bit) from the respective data signal d0-d3 on a rising edge of a clock signal clk, and outputs the captured data value q0-q3. Thus, during each clock cycle, the register 100 captures a plurality of data values (e.g., bits) in parallel from the data signals d0-d3 on a rising edge of the clock signal clk, and outputs the captured data values q0-q3 in parallel.

In the scan mode, the first scan multiplexer 110a couples a scan input of the multi-bit register 100 (labeled "sin" in FIG. 1) to the input of the first latch 120a. Each of the remaining scan multiplexers 110b-110d couples the output of the previous latch to the input of the respective latch. For instance, the second scan multiplexer 110b couples the output of the first latch 120a to the input of the second latch 120b, the third multiplexer 110c couples the output of the second latch 120b to the input of the third latch 120c, and so forth. In the example shown in FIG. 1, the scan input of each multiplexer (labeled "1") is inverting. The output of the fourth latch 120d (last latch) is coupled to an inverting input of the NAND gate 130. As a result, the scan signal propagates sequentially through the latches 120a-120d of the multi-bit register 100, and is finally output at the output of the NAND gate 130 (labeled "sout").

Thus, in the scan mode, a scan signal is scanned through the latches 120a-120d of the register 100. The scan signal may comprise a known test pattern, and the functionality of the register 100 may be evaluated by comparing the output scan signal from the register 100 with an expected output scan signal based on the known test pattern.

In the example shown in FIG. 1, the operating mode of the multi-bit register 100 is controlled by a scan mode signal received at a scan mode input (labeled "scan mode" in FIG. 1). The scan mode signal is input to each scan multiplexer 110a-110d to control whether the scan multiplexer couples the respective input data signal or scan signal to the input of the respective latch. The scan mode signal is also input to the NAND gate 130.

When the scan mode signal is logic zero, each scan multiplexer 110a-110d couples the data signal at the respective data input (0) to the input of the respective latch. In addition, the output of the NAND gate 130 is fixed at logic one. Thus, the multi-bit register 100 operates in the functional mode when the scan mode signal is zero.

When the scan mode signal is logic one, each scan multiplexer 110a-110d couples the scan signal at the respective scan input (1) to the input of the respective latch. The NAND gate 130 outputs the scan signal at the scan output (sout) of the register 100. Thus, the multi-bit register 100 operates in the scan mode when the scan mode signal is one.

In the scan mode, the output of each of the first, second and third latches 120a-120c needs to be delayed before being input to the next latch in the scan chain in order to meet the hold-time requirement of the next latch. This delay may be provided by inserting a delay circuit 125a-125c between the output of each latch and the input of the next latch in the scan chain, as shown in FIG. 1.

Figure 2A:
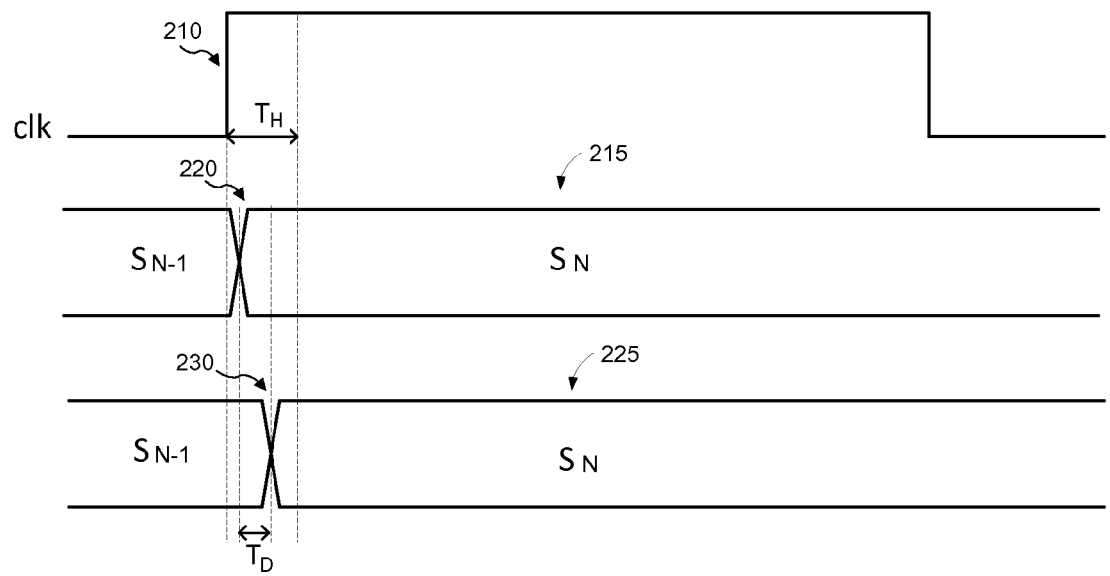
FIGS. 2A and 2B are timing diagrams illustrating an example of a hold-time requirement for a latch.

FIG. 2A shows an example of a timing diagram in the scan mode, in which the first and second latches 120a and 120b comprise flip-flops. The timing diagram includes an example of the clock signal clk, the scan signal at the output 215 of the first latch 120a, and the scan signal at the input 225 of the second latch 120c. Each of the first and second latches 120a and 120b samples the scan signal at the respective input on a rising edge of the clock signal clk. For ease of discussion, the timing of the clock signal at the first latch 120a is assumed to be approximately the same as the timing of the clock signal at the second latches 120b, although it is to be appreciated that this need not be the case.

In the example shown in FIG. 2A, the first latch 120a captures a sample (labeled "$S_N$") of the scan signal on a rising edge 210 of the clock signal clk. After a short delay, the output of the first latch 120a transitions 220 from the previous sample (labeled "$S_{N-1}$") of the scan signal to the current sample ($S_N$) of the scan signal captured on the rising edge 210 of the clock signal clk, as shown in FIG. 2A. The scan signal propagates from the output of the first latch 120a to the input of the second latch 120b, in which the scan signal is delayed by $T_D$. As a result, the transition 230 from the previous scan sample ($S_{N-1}$) to the current scan sample ($S_N$) is delayed by $T_D$ at the input of the second latch 120b, as shown in FIG. 2A.

In this example, the scan signal at the input of the second latch 120b needs to be stable for a time period after the rising edge 210 of the clock signal clk in order for the second latch 120b to properly sample the scan signal. This time period may be referred to as the hold time $T_H$ of the second latch 120b. In the example in FIG. 2A, the scan signal at the input of the second latch 120b transitions 230 from the previous scan sample ($S_{N-1}$) to the current scan sample ($S_N$) during the hold time $T_H$ of the second latch 120b, resulting in a hold-time violation at the second latch 120b.

Figure 2B:
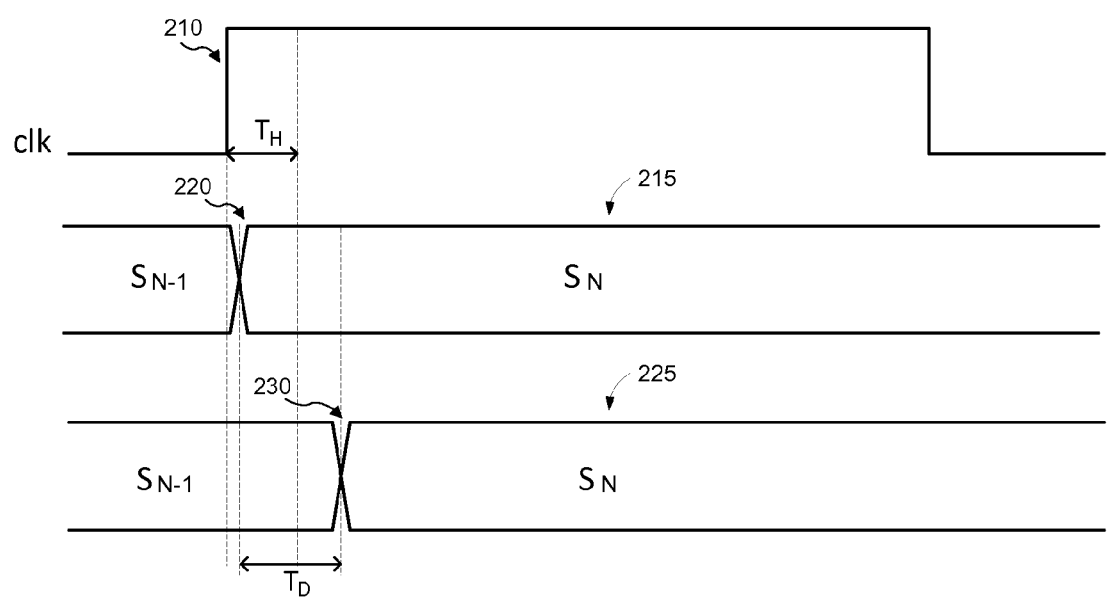

The hold-time violation may be corrected by increasing the delay in the scan path between the output of the first latch 120a and the input of the second latch 120b. In this regard, FIG. 2B shows an example of a timing diagram in which the delay $T_D$ has been increased by delay circuit 125a. As a result of the increased delay $T_D$, the scan signal at the input of the second latch 120b transitions 230 outside the hold time $T_H$ of the second latch 120b, and the hold time of the second latch 120b is satisfied.

Figure 3A:
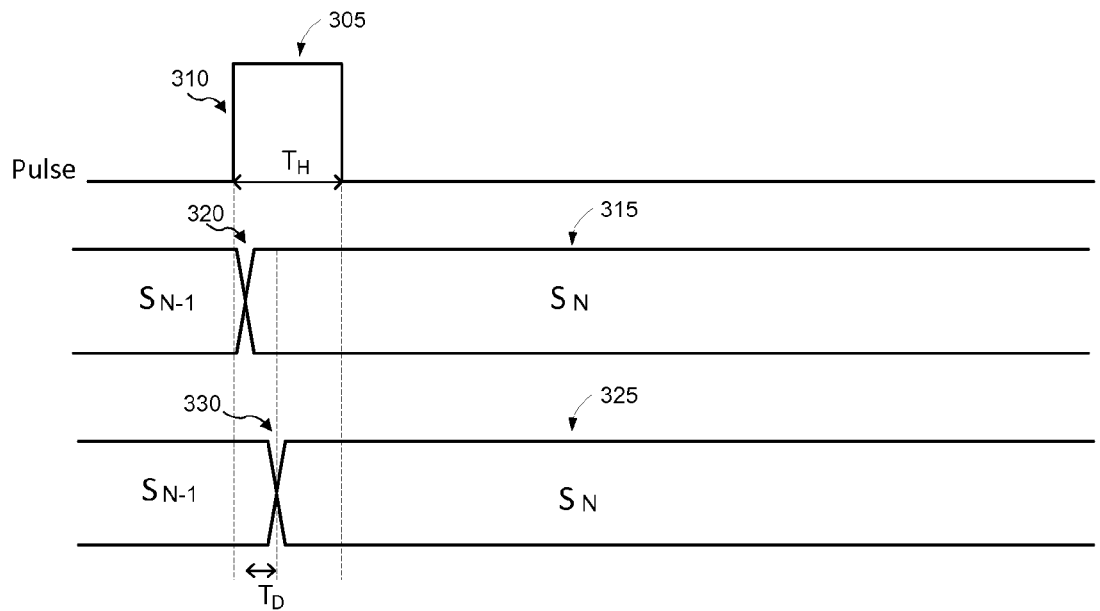
FIGS. 3A and 3B are timing diagrams illustrating an example of a hold-time requirement for a pulsed latch.

FIGS. 2A and 2B show an example in which the first and second latches 120a and 120b comprise flip-flops. The first and second latches 120a and 120b may also comprise pulsed latches. In this regard, FIG. 3A shows an example of a timing diagram in the scan mode, in which the first and second latches 120a and 120b comprise pulsed latches. The timing diagram includes an example of a pulse signal, the scan signal at the output 315 of the first latch 120a, and the scan signal at the input 325 of the second latch 120c. The pulse signal may be generated from a clock signal using a pulse generator (not shown), in which the pulse signal may comprise one pulse per clock cycle. Each of the first and second latches 120a and 120b samples the scan signal at the respective input on the rising edge of a pulse. For ease of discussion, the timing of the pulse signal at the first latch 120a is assumed to be approximately the same as the timing of the pulse signal at the second latches 120b, although it is to be appreciated that this need not be the case.

In the example shown in FIG. 3A, the first latch 120a captures a sample (labeled "$S_N$") of the scan signal on the rising edge 310 of a pulse 305 of the pulse signal. After a short delay, the output of the first latch 120a transitions 320 from the previous sample (labeled "$S_{N-1}$") of the scan signal to the current sample ($S_N$) of the scan signal, as shown in FIG. 3A. The scan signal propagates from the output of the first latch 120a to the input of the second latch 120b, in which the scan signal is delayed by $T_D$. As a result, the transition 330 from the previous scan sample ($S_{N-1}$) to the current scan sample ($S_N$) is delayed by $T_D$ at the input of the second latch 120b, as shown in FIG. 3A.

In this example, the scan signal at the input of the second latch 120b needs to be stable for the duration of the pulse 305 in order for the second latch 120b to properly sample the scan signal. This time duration may be referred to as the hold time $T_H$ of the second latch 120b. In the example in FIG. 3A, the scan signal at the input of the second latch 120b transitions 330 from the previous scan sample ($S_{N-1}$) to the current scan sample ($S_N$) within the duration of the pulse 305, resulting in a hold-time violation at the second latch 120b.

Figure 3B:
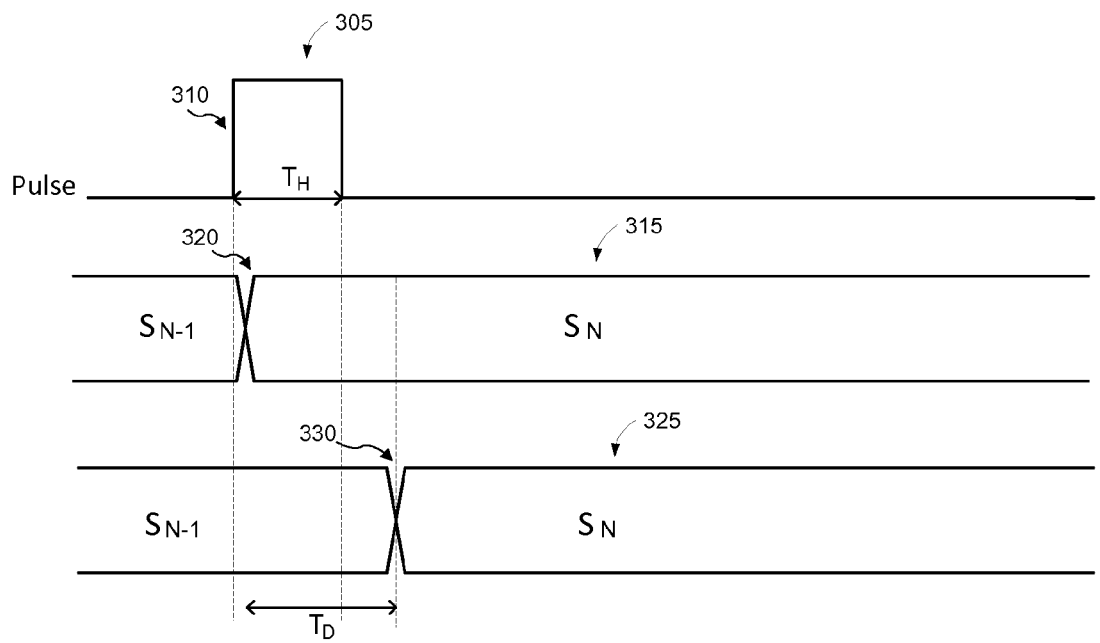

The hold-time violation may be corrected by increasing the delay in the scan path between the output of the first latch 120a and the input of the second latch 120b. In this regard, FIG. 3B shows an example of a timing diagram in which the delay $T_D$ has been increased by delay circuit 125a. As a result of the increased delay $T_D$, the scan signal at the input of the second latch 120b transitions 330 outside the pulse 305, and the hold time of the second latch 120b is satisfied.

The duration of a pulse in a pulsed latch may be longer than the hold time of a flip-flop. Thus, a scan signal may need to be delayed by a larger amount for pulsed latches compared with flip-flops in order to meet hold-time requirements.

Figure 4:
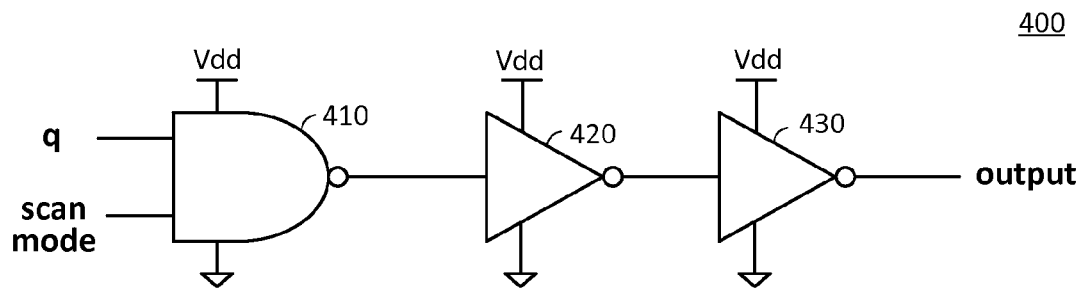
FIG. 4 shows an example of a delay circuit in a scan path.

As discussed above, delay in a scan path may be increased to satisfy the hold-time requirement of a latch by inserting a delay circuit into the delay path. In this regard, FIG. 4 shows an example of a delay circuit 400 that may be inserted into a scan path to meet the hold-time requirement of a latch. The delay circuit 400 may be used to implement any one of the delay circuits 125a-125c shown in FIG. 1.

The delay circuit 400 comprises a NAND gate 410, a first inverter 420, and a second inverter 430 coupled in series. The NAND gate 410 has a scan input coupled to the output (denoted "q") of a latch in a scan chain, and a scan mode input coupled to the scan mode signal (denoted "scan mode"). The output of the delay circuit (denoted "output") may be coupled to the input of the next latch in the scan chain. For example, the delay circuit may be coupled to the input of the next latch through a respective scan multiplexer.

In the scan mode, the scan mode signal is logic one. This causes the NAND gate 410 to act as an inverter. As a result, the scan signal input to the delay circuit 400 propagates through the NAND gate 410 and the two inverters 420 and 430, and is therefore delayed by the NAND gate 410 and the two inverters 420 and 430.

In the functional mode, the scan mode signal is logic zero. This causes the NAND gate 410 to output a logic one regardless of the logic state at the scan input (q). As a result, the delay circuit 400 is disabled. In other words, a signal at the scan input (q) is blocked from propagating through the delay circuit 400. When the delay circuit 400 is disabled, the output logic states of the NAND gate 410 and the two inverters 420 and 430 remain fixed (i.e., do no toggle). Thus, the NAND gate 410 and the two inverters 420 and 430 may remain static in the functional mode, and therefore consume little to no dynamic power in the functional mode.

If the delay of the delay circuit 400 needs to be increased in order to meet the hold-time requirement of the next latch, the delay may be increased by adding additional delay devices (e.g., inverters) in the delay circuit 400. The delay of the delay circuit 400 may also be increased by increasing the delay of a delay device (e.g., inverter) in the delay circuit. This is done, for example, by stacking additional transistors in the delay device. However, both of these approaches increase the area of the delay circuit 400, which increases scan overhead.

To address this, embodiments of the present disclosure increase the delay of a delay circuit by reducing the supply voltage of one or more delay devices (e.g., inverters) in the delay circuit. For example, the reduced supply voltage may be lower than the supply voltage of latches coupled to the delay circuit. The reduced supply voltage slows down the one or more delay devices, thereby increasing the delay of the delay circuit without having to add an additional delay device (e.g., inverter) and/or stack additional transistors in a delay device.

Figure 5:
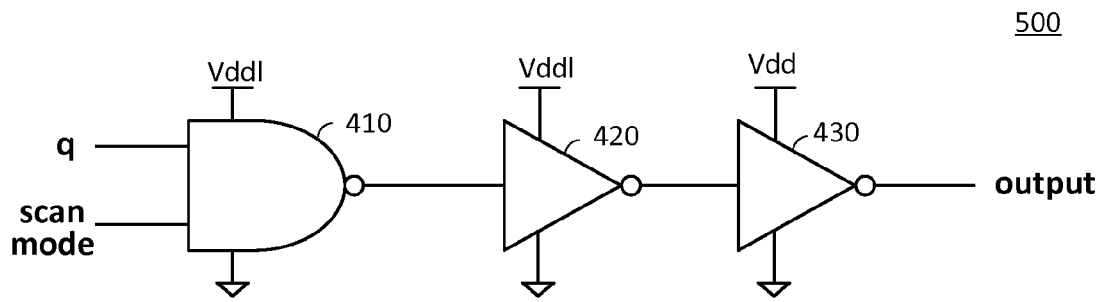
FIG. 5 shows an example of a delay circuit in a scan path in which a portion of the delay circuit is operated at a reduced voltage to increase delay according to an embodiment of the present disclosure.

In this regard, FIG. 5 shows a delay circuit 500 according to an embodiment of the present disclosure. The delay circuit 500 may be used to implement any one of the delay circuits 125a-125b shown in FIG. 1. In this embodiment, the NAND gate 410 and the first inverter 420 are powered by a reduced supply voltage (denoted "Vdd1"), and the second inverter 430 is powered by a full supply voltage (denoted "Vdd"). For example, the reduced supply voltage Vdd1 may be 0.01 volts or more below the full supply voltage Vdd. In another example, the reduced supply voltage Vdd1 may be 0.1 volts or more below the full supply voltage Vdd.

In this embodiment, the scan input (q) of the NAND gate 410 may be coupled to the output of a latch in a scan chain, in which the latch is powered by the full supply voltage Vdd. Thus, the scan signal input to the scan input (q) of the NAND gate 410 may be full rail-to-rail (e.g., have a logic one state approximately equal to Vdd and a logic zero state approximately equal to ground). The scan mode signal input to the scan mode input (scan mode) of the NAND gate 410 may also be full rail-to-rail (e.g., have a logic one state approximately equal to Vdd and a logic zero state approximately equal to ground).

The output of the delay circuit 500 may be coupled to the next latch in the scan chain through a respective scan multiplexer. The scan multiplexer may be powered by the full supply voltage Vdd. In this regard, the output of the delay circuit 500 may be full rail-to-rail (e.g., has a logic one state approximately equal to Vdd and a logic zero state approximately equal to ground) in order to drive the scan input of the scan multiplexer full rail-to-rail. This may be accomplished by powering the second inverter 430 (last inverter in the delay circuit 500) with the full supply voltage Vdd, as discussed further below.

In the scan mode, the scan mode signal is logic one. This causes the NAND gate 410 to act as an inverter. As a result, the scan signal input to the delay circuit 500 propagates through the NAND gate 410 and the two inverters 420 and 430, and is therefore delayed by the NAND gate 410 and the two inverters 420 and 430. The reduced supply voltage Vdd1 slows down the first NAND gate 410 and the first inverter 420, thereby increasing the delay of the delay circuit 500. The voltage swing at the output of the NAND gate 410 and the voltage swing at the output of the first inverter 410 are approximately equal to Vdd1 (i.e., switch between Vdd and ground). The voltage swing at the second inverter 430 is approximately equal to Vdd in order to drive the scan input of the scan multiplexer coupled to the output of the delay circuit 500 full rail-to-rail.

In the functional mode, the scan mode signal is logic zero. This causes the NAND gate 410 to output a logic one regardless of the logic state at the scan input (q). In this embodiment, the logic one at the output of the NAND gate 410 corresponds to a voltage of Vdd1. The logic one at the output of the NAND gate 410 is input to the first inverter 420, and therefore drives the output of the first inverter 430 to a logic zero. The logic zero at the output of the first inverter 420 is input to the second inverter 430, and therefore drives the output of the second inverter 430 to a logic one. The logic one at the output of the second inverter 430 corresponds to a voltage of Vdd. Thus, in the functional mode, the outputs of the NAND gate 410, the first inverter 420 and the second inverter 430 are static at logic one, logic zero and logic one, respectively. The static outputs in the functional mode significantly reduce dynamic power consumption of the delay circuit 500 in the functional mode.

As discussed above, the first inverter 420 outputs a logic zero to the second inverter 430 in the functional mode. Having the first inverter 420 output a logic zero to the second inverter 430 instead of a logic one in the functional mode significantly reduces leakage current in the second inverter 430 in the functional mode. This may be explained with reference to FIG. 6.

Figure 6:
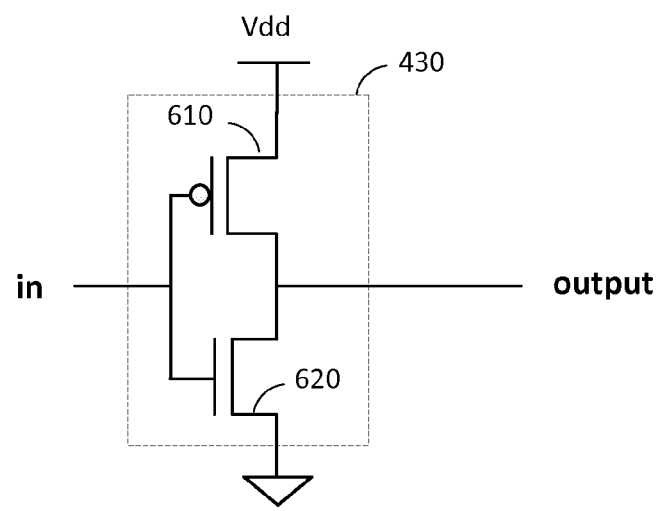
FIG. 6 shows an example of an inverter in a delay circuit according to an embodiment of the present disclosure.

FIG. 6 shows an example in which the second inverter 420 comprises a p-type metal-oxide-semiconductor (PMOS) transistor 610 and an n-type metal-oxide-semiconductor (NMOS) transistor 620. The source of the PMOS transistor 610 is coupled to the full supply voltage Vdd, and the source of the NMOS transistor 620 is coupled to ground. The gates of the PMOS and NMOS transistors 610 and 620 are coupled to the input (denoted "in") of the second inverter 430, and the drains of the PMOS and NMOS transistors 610 and 620 are coupled to the output (denoted "output") of the second inverter 430.

As discussed, having the first inverter 420 output a logic zero to the second inverter 430 instead of a logic one in the functional mode reduces leakage current. This may be demonstrated by examining what would happen if the first inverter 420 output a logic one to the second inverter 430 in the functional mode. In this case, the first inverter 420 would output the reduced supply voltage Vdd1 to the gates of the PMOS and NMOS transistors 610 and 620 since the first inverter 420 is powered by the reduced supply voltage Vdd1. As a result, the NMOS transistor 620 would be turned on assuming Vdd1 is greater than the threshold voltage of the NMOS transistor 620. In addition, the PMOS transistor 610 would be weakly turned on. This is because the source-to-gate voltage of the PMOS transistor 610 would be Vdd−Vdd1 (e.g., 0.2V) instead of approximately zero volts. As a result, leakage current would flow from Vdd to ground through the PMOS transistor 610 and the NMOS transistor 620 of the second inverter 430. The leakage current would depend on the magnitude of Vdd−Vdd1 with a larger Vdd−Vdd1 resulting in a larger leakage current. As a result, reducing Vdd1 to increase delay would have the negative effect of increasing the leakage current in the functional mode.

Having the first inverter 420 output a logic zero to the second inverter 430 in the functional mode significantly reduces the leakage current discussed above. This is because the logic zero turns off the NMOS transistor 620 in the second inverter 430, which blocks current flow through the NMOS transistor 620, and therefore blocks current flow from Vdd to ground through the second inverter 430.

In general, leakage current in the functional mode can be reduced by having the last inverter in the delay circuit powered by the reduced supply voltage Vdd1 output a logic zero. This may be accomplished, for example, by coupling an odd number of inverters powered by the reduced supply voltage Vdd1 to the output of the NAND gate 410. Since the NAND gate 410 outputs a logic one in the functional mode, this helps ensure that the last inverter powered by the reduced supply voltage Vdd1 outputs a logic zero in the functional mode.

Leakage current may be much less of a concern in the scan mode. This is because a register may only operate in the scan mode for a short period of time during testing. The register may operate a vast majority of the time in the functional mode. Thus, leakage current in the functional mode may have a much greater impact on energy consumption, and therefore needs to be addressed. For example, when the register is used in a battery-powered device, leakage current in the functional mode may have a much greater impact on the battery life of the device.

Figure 7:
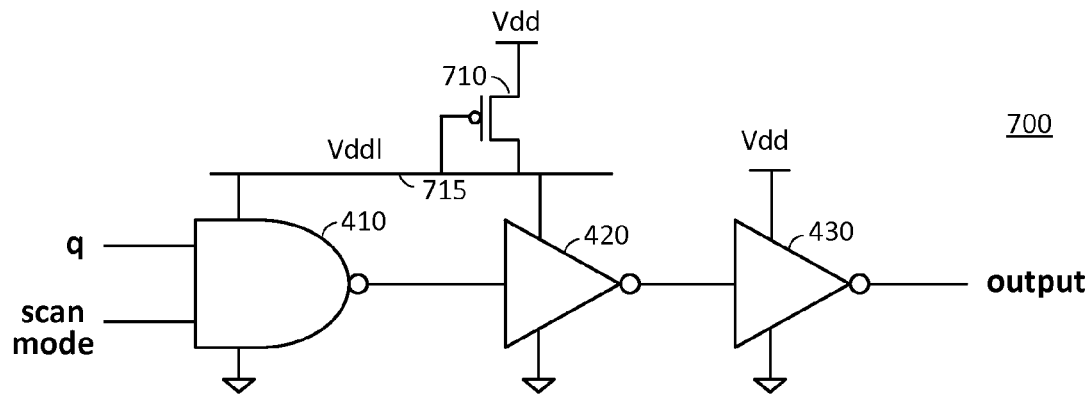
FIG. 7 shows an example of a circuit for generating a reduced supply voltage according to an embodiment of the present disclosure.

FIG. 7 shows a delay circuit 700 in which the reduced supply voltage Vdd1 is generated from the full supply voltage Vdd according to an embodiment of the present disclosure. In this embodiment, the delay circuit 700 comprises a diode-connected PMOS transistor 710 having a source coupled to the full supply voltage Vdd, and a gate and a drain coupled to a reduced supply rail 715. The NAND gate 410 and the first inverter 420 are coupled to the reduced supply rail 715.

The voltage Vdd1 on the reduced supply voltage is approximately equal to the full supply voltage Vdd minus the voltage drop across the diode-connected PMOS transistor 710. In one example, the voltage drop may be approximately equal to the threshold voltage (e.g., 0.2 V) of the PMOS transistor 710. Thus, the reduced supply voltage Vdd1 on the reduced supply rail 710 is produced by dropping a portion of the supply voltage Vdd across the diode-connected PMOS transistor 710.

Figure 8:
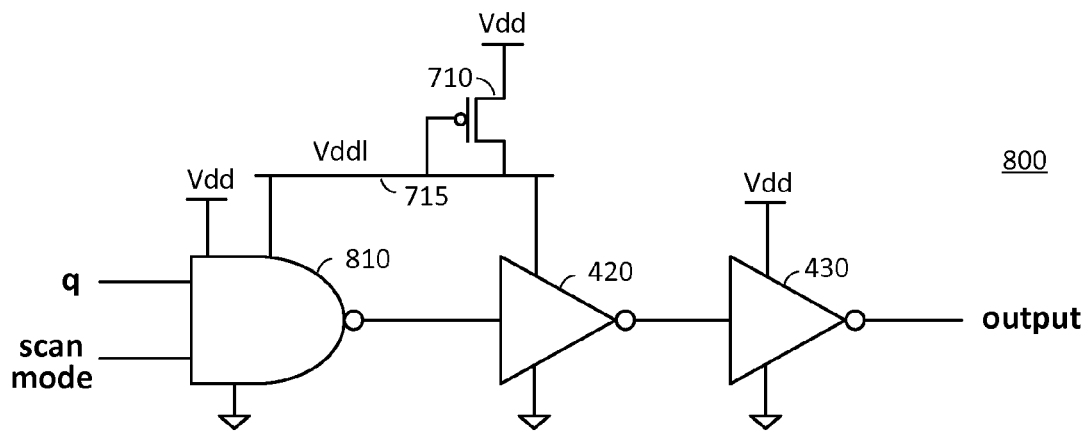
FIG. 8 shows an example of a delay circuit in a scan path in which a portion of the delay circuit is operated at a reduced voltage to increase delay according to another embodiment of the present disclosure.

FIG. 8 shows a delay circuit 800 according to another embodiment of the present disclosure. In this embodiment, the NAND gate 810 is powered by both the full supply voltage Vdd and the reduced supply voltage Vdd1 from the reduced supply rail 715.

In the scan mode, the NAND gate 810 is configured to use the reduced supply voltage Vdd1 to toggle the output of the NAND gate 810 (i.e., switch the output between logic one and logic zero). This is done to increase the delay of the NAND gate 810 in the scan mode. As a result, the voltage swing of the NAND gate 810 in the scan mode is approximately equal to Vdd1 (i.e., switch between Vdd1 and ground).

In the functional mode, the NAND gate 810 is configured to use the full supply voltage Vdd to output a logic one at the full supply voltage Vdd. As a result, the NAND gate 810 outputs the full supply voltage Vdd to the input of the first inverter 420 in the functional mode. This reduces leakage current from Vdd to ground through the diode-connected PMOS transistor 710 and the first inverter 420, as discussed further below.

Figure 9:
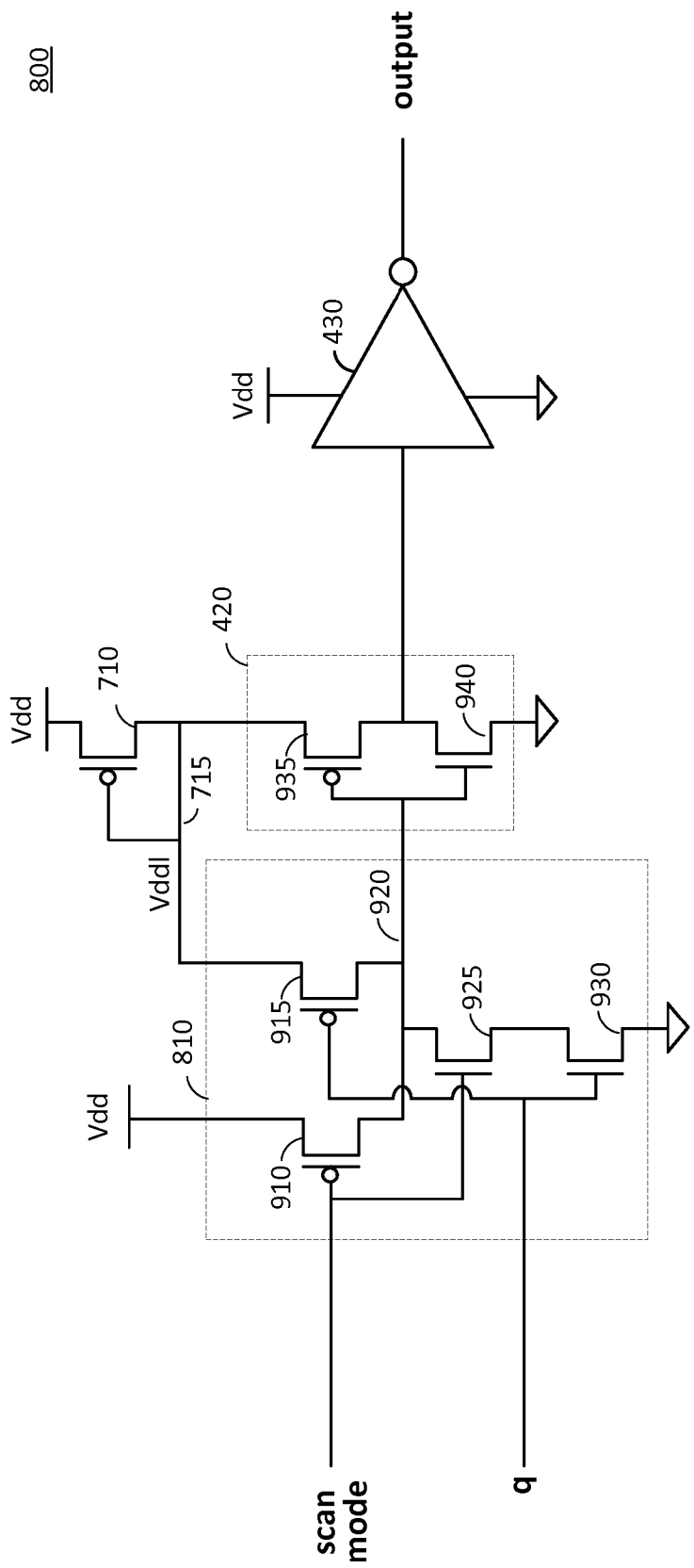
FIG. 9 shows an exemplary implementation of a delay circuit according to an embodiment of the present disclosure.

FIG. 9 shows an exemplary implementation of the NAND gate 810 according to an embodiment of the present disclosure. In this embodiment, the NAND gate 810 comprises a first PMOS transistor 910, a second PMOS transistor 915, a first NMOS transistor 925, and a second NMOS transistor 930. The first PMOS transistor 910 has a source coupled to the full supply voltage Vdd, a gate coupled to the scan mode input (scan mode) of the delay circuit 800, and a drain. The second PMOS transistor 915 has a source coupled to the reduced supply voltage Vdd1, a gate coupled to the scan input (q) of delay circuit 800, and a drain coupled to the drain of the first PMOS transistor 915. In the example in FIG. 9, the scan signal is denoted "q" because the scan signal is received from an output of a latch.

The first NMOS transistor 925 has a drain coupled to the drains of the first and second PMOS transistors 910 and 915, a gate couple to the scan mode input (scan mode), and a source. The second NMOS transistor 930 has a drain coupled to the source of the first NMOS transistor 925, a gate coupled to the scan input (q), and a source coupled to ground. The output 920 of the NAND gate 810 is taken at the drains of the first and second PMOS transistors 910 and 915, as shown in FIG. 9.

The first inverter 420 may be a complementary-pair inverter comprising a third PMOS transistor 935 and a third NMOS transistor 940. In this example, the source of the third PMOS transistor 930 is coupled to the reduced supply rail 715 and the source of the third NMOS transistor 940 is coupled to ground. The gates of the third PMOS transistor 935 and the third NMOS transistor 940 are coupled to the output 920 of the NAND gate 810, and the drains of the third PMOS transistor 935 and the third NMOS transistor 940 are coupled to the input of the second inverter 430.

In the scan mode (i.e., scan mode signal equal to logic one), the first PMOS 910 is turned off, and the first NMOS 925 is turned on. As a result, the second PMOS transistor 915 and the second NMOS 930 form an inverter having an input coupled to the scan input (q). The inverter is powered by the reduced supply voltage Vdd1 on the reduced supply rail 715. Thus, in the scan mode, the NAND gate 810 acts as an inverter powered by the reduced supply voltage Vdd1, in which the reduced supply voltage Vdd1 increases the delay of the inverter. The voltage swing at the output 920 of the NAND gate 810 in the scan mode is approximately equal to Vdd1.

In the functional mode (i.e., scan mode signal equal to logic zero), the first PMOS transistor 910 is turned on. As a result, the first PMOS transistor 910 pulls up the output 920 of the NAND gate 810 to the full supply voltage Vdd regardless of the logic state of the scan input (q). Thus, the NAND gate 810 outputs a voltage approximately equal to the full supply voltage Vdd to the gate of the third PMOS transistor 935 in the first inverter 420. This helps ensure that the source-to-gate voltage of the third PMOS transistor 935 is zero volts, and therefore that the third PMOS transistor 935 is turned off in the functional mode, thereby reducing leakage current.

Figure 10:
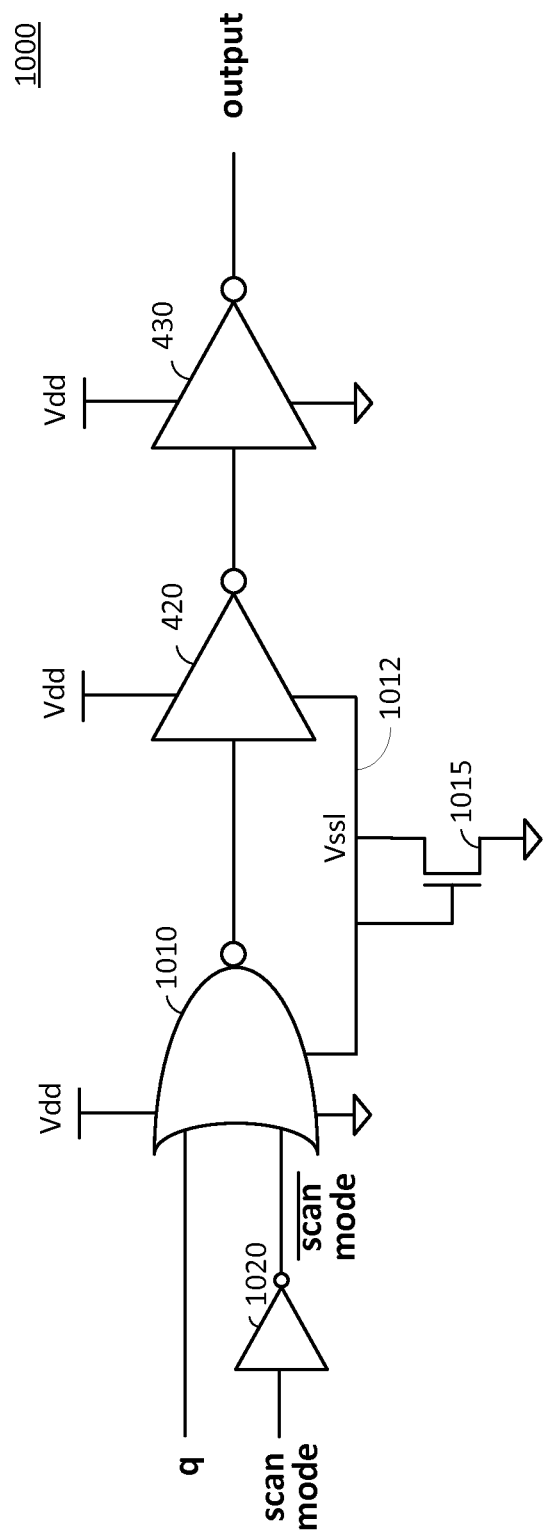
FIG. 10 shows an example of a delay circuit in a scan path comprising a NOR gate according to an embodiment of the present disclosure.

Thus, in the functional mode, the NAND gate 410 is fixed at logic one, in which the logic one is at a voltage approximately equal to the full supply voltage Vdd. The output of the first inverter 420 is fixed at logic zero. Finally, the output of the second inverter 230 is fixed at logic one, in which the logic one is at a voltage approximately equal to the fully supply voltage Vdd. In the above examples, a NAND gate is used for the first delay stage of the delay circuit. It is to be appreciated that other types of logic gates may be used for the first delay state, and therefore that the present disclosure is not limited to this example. For example, FIG. 10 shows a delay circuit 1000 comprising a NOR gate 1010 instead of a NAND gate according to an embodiment of the present disclosure.

In this embodiment, the delay circuit 1000 includes a diode-connected NMOS transistor 1015 coupled between supply rail 1012 and ground. More particularly, the diode-connected transistor 1015 has a drain and a gate coupled to supply rail 1012, and a source coupled to ground. The diode-connected NMOS transistor 1015 generates a supply voltage of Vss1 on the supply rail 1012, in which the supply voltage Vss1 is approximately equal to the voltage drop across the diode-connected NMOS transistor 1015. For example, the supply Vss1 may be approximately equal to the threshold voltage of the diode-connected NMOS transistor 1015.

In this embodiment, the NOR gate 1010 is powered by both the full supply voltage Vdd and a reduced voltage Vdd–Vss1, where Vdd–Vss1 is less than Vdd since Vss1 is greater than ground. The NOR gate 1010 has a scan input (q) coupled to the output of a latch, and a scan mode input coupled to the scan mode signal via an inverter 1020. Thus, the NOR gate 1010 receives the inverse of the scan mode signal (denoted "scanmode"). Also, the first inverter 420 is powered by the reduced supply voltage Vdd–Vss1, as shown in FIG. 10.

In the scan mode, the NOR gate 1010 acts an inverter powered by the reduced voltage Vdd–Vss1, in which the reduced voltage Vdd–Vss1 is used toggle the output of the NOR gate 1010 (i.e., switch the output between logic one and logic zero). This is done to increase the delay of the NOR gate 1010 in the scan mode. As a result, the output voltage swing of the NOR gate 1010 in the scan mode is approximately equal to Vdd1–Vss1, in which a logic one at the output of the NOR gate 1010 is approximately at Vdd and a logic zero at the output of the NOR gate 1010 is approximately at Vss1. In addition, the output voltage swing of the first inverter 420 is approximately equal to Vdd1–Vss1, in which a logic one at the output of the first inverter 420 is approximately at Vdd and a logic zero at the output of the first inverter 420 is approximately at Vss1.

In the functional mode, the NOR gate 1010 is configured to output a voltage approximately equal to ground. This reduces leakage current from Vdd to ground through the first inverter 420 and the diode-connected NMOS transistor 1015, as discussed further below. The first inverter 420 outputs a logic one at the full supply voltage Vdd to the second inverter 430.

Figure 11:
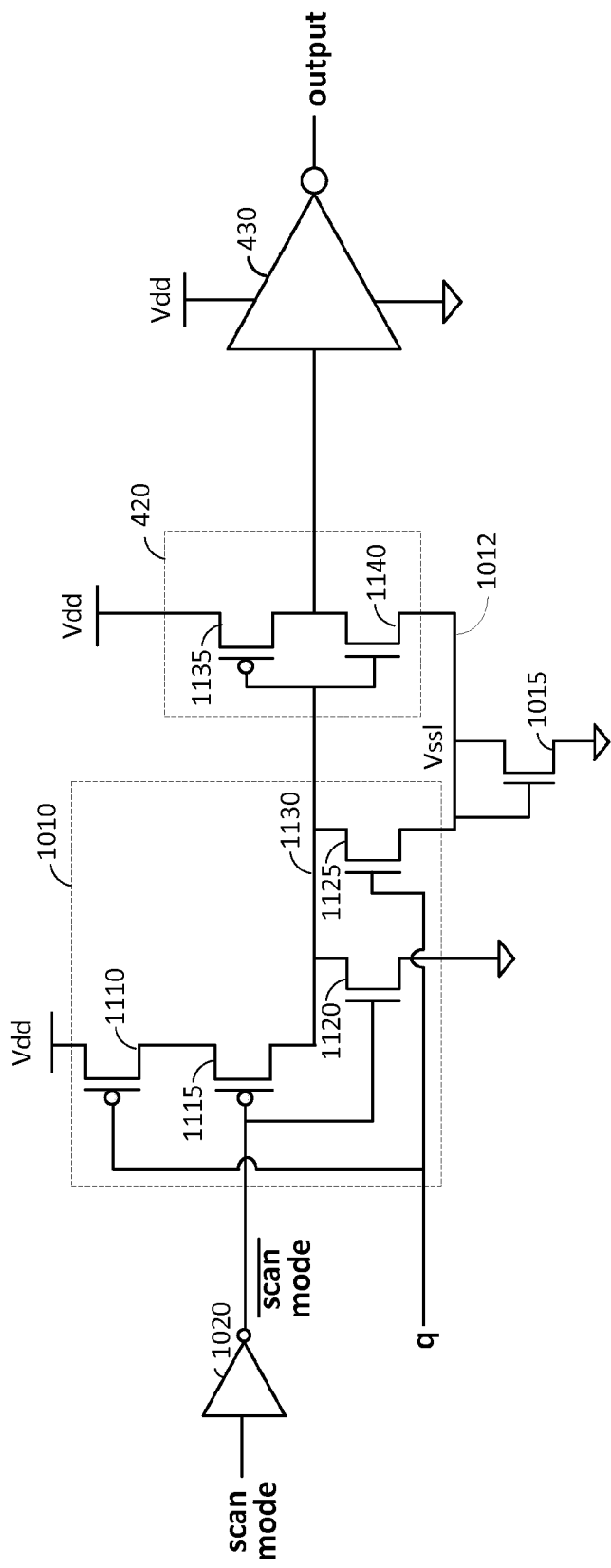
FIG. 11 shows an exemplary implementation of a delay circuit according to another embodiment of the present disclosure.

FIG. 11 shows an exemplary implementation of the NOR gate 1010 according to an embodiment of the present disclosure. In this embodiment, the NOR gate 1010 comprises a first PMOS transistor 1110, a second PMOS transistor 1115, a first NMOS transistor 1120, and a second NMOS transistor 1125. The first PMOS transistor 1110 has a source coupled to the full supply voltage Vdd, a gate coupled to the scan input (q), and a drain. The second PMOS transistor 1115 has a source coupled to the drain of the first PMOS transistor 1110, a gate coupled to the inverse of the scan mode signal (scanmode), and a drain.

The first NMOS transistor 1120 has a drain coupled to the drain of the second PMOS transistor 1115, a gate couple to the inverse of the scan mode signal (scanmode), and a source coupled to ground. The second NMOS transistor 1125 has a drain coupled to the drain of the second PMOS transistor 1115, a gate coupled to the scan input (q), and a source coupled to the supply voltage Vss1 on supply rail 1012. The output 1130 of the NOR gate 1010 is taken at the drains of the first and second NMOS transistors 1120 and 1125, as shown in FIG. 11.

The first inverter 420 may be a complementary-pair inverter comprising a third PMOS transistor 1135 and a third NMOS transistor 1140. In this example, the source of the third PMOS transistor 1135 is coupled to Vdd and the source of the third NMOS transistor 1140 is coupled to Vss1 on rail 1012. The gates of the third PMOS transistor 1135 and the third NMOS transistor 1140 are coupled to the output 1130 of the NOR gate 1010, and the drains of the third PMOS transistor 1135 and the third NMOS transistor 1140 are coupled to the input of the second inverter 430.

In the scan mode (i.e., inverse scan mode signal equal to logic zero), the second PMOS 1115 is turned on, and the first NMOS 1120 is turned off. As a result, the first PMOS transistor 1110 and the second NMOS 1125 form an inverter having an input coupled to the scan input (q). The inverter is powered by the reduced voltage Vdd−Vss1 since the source of the second NMOS transistor 1125 is coupled to supply voltage Vss1 on supply rail 1012. Thus, in the scan mode, the NOR gate 1010 acts as an inverter powered by the reduced voltage Vdd−Vss1, which increases the delay of the inverter. The voltage swing at the output 1130 of the NOR gate 1010 in the scan mode is approximately equal to Vdd−Vss1, in which logic one at the output 1130 is approximately at Vdd and logic zero at the output 1130 is approximately at Vss1.

In the functional mode (i.e., inverse scan mode signal equal to logic one), the second PMOS transistor 1115 is turned off and the first NMOS transistor 1120 is turned on. As a result, the first NMOS transistor 1120 pulls down the output 1130 of the NOR gate to ground regardless of the logic state of the scan input (q). Thus, the NOR gate 1110 outputs a voltage approximately equal to ground to the third NMOS transistor 1140 in the first inverter 420. This helps ensure that the gate-to-source voltage of the third NMOS transistor 1140 is zero volts, and therefore that the third NMOS transistor 1140 is turned off in the functional mode, thereby reducing leakage current.

Thus, in the functional mode, the NOR gate 1010 is fixed at logic zero, in which the logic zero is approximately at ground. The output of the first inverter 420 is fixed at logic one, in which the logic one is at a voltage approximately equal to Vdd. This reduces leakage current in the second inverter 430 by turning off the PMOS transistor in the second inverter 430, assuming the second inverter 430 comprises a complementary-pair inverter. Finally, the output of the second inverter 430 is fixed at logic zero, in which the logic zero is approximately at ground.

Figure 12:
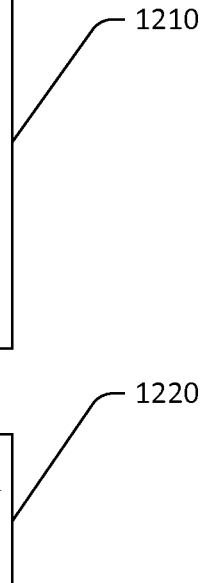
FIG. 12 is a flowchart of a method for signal delay in a scan path according to an embodiment of the present disclosure.

FIG. 12 is a flow diagram illustrating a method 1200 for signal delay in a scan path according to an embodiment of the present disclosure. The method 1200 may be performed by delay circuit 500, 700, 800 or 1000.

At step 1210, in a scan mode, a scan signal in the scan path is delayed by propagating the scan signal through a plurality of delay devices coupled in series, wherein a first one of the delay devices is powered by a first voltage, a second one of the delay devices is powered by a second voltage, and the second voltage is greater than the first voltage. For example, the second voltage (e.g., Vdd) may be 0.01 volts or greater than the first voltage (e.g., Vdd1 or Vdd−Vss1). The first voltage (e.g., Vdd1 or Vdd−Vss1) may be generated from the second voltage (e.g., Vdd) by dropping a portion of the second voltage across a diode-connected transistor (e.g., diode-connected PMOS transistor 710 or diode-connected NMOS transistor 1015).

At step 1220, in a functional mode, the delay devices are disabled. For example, the first one of the delay devices may comprise a NAND gate (e.g., NAND gate 410 or 810), and the delay devices may be disable by inputting a logic zero to one of the inputs of the NAND gate. As a result, the NAND gate outputs a logic one regardless of the logic state at the other input of the NAND gate, thereby blocking a signal at the other input from propagating through the delay devices. In another example, the first one of the delay devices may comprise a NOR gate (e.g., NOR gate 1010), and the delay devices may be disabled by inputting a logic one to one of the inputs of the NOR gate. In this example, the logic one may be generated by inverting the scan mode signal. As a result, the NOR gate outputs a logic zero regardless of the logic state at the other input of the NOR gate, thereby blocking a signal at the other input from propagating through the delay devices.

Those skilled in the art would appreciate that embodiments of the present disclosure are not limited to the examples described herein. For example, the scan input of a delay circuit may be coupled to an nq output of the previous latch instead of the q output of the previous latch, in which the nq output is the logical inverse of the q output. Also, it is to be appreciated that the scan inputs of the scan multiplexers may be inverting or non-inverting, and is therefore not limited to the inverting scan inputs shown in FIG. 1. Further, embodiments of the present disclosure may be used in multi-bit registers comprising any number of latches, and are therefore not limited to the exemplary four-bit register shown in FIG. 1.

It is also to be appreciated that the delay circuit 800 is not limited to three delay devices, and may therefore comprise other numbers of delay devices. For example, the delay circuit may comprise three inverters coupled in series between the output of the NAND gate 810 and the input of the last inverter 430, in which the three inverters are powered by the reduced supply voltage Vdd1 to achieve longer delay.

It is also to be appreciated that the delay circuit 1000 is not limited to three delay devices, and may therefore comprise other numbers of delay devices. For example, the delay circuit may comprise three inverters coupled in series between the output of the NOR gate 1010 and the input of the last inverter 430, in which the three inverters are powered by the reduced voltage Vdd−Vss1 to achieve longer delay As used herein, the term powered by a voltage may refer to a voltage that is applied across a delay device to power the delay device. For example, the second inverter 430 is coupled between supply voltage Vdd and ground and is therefore power by voltage Vdd. In another example, the first inverter 420 in FIG. 8 is coupled between supply voltage Vdd1 and ground, and is therefore powered by voltage Vdd1. In yet another example, the first inverter 420 in FIG. 10 is coupled between supply voltages Vdd and Vss1, and is therefore powered by voltage Vdd−Vss1.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A method for signal delay in a scan path, comprising:
   in a scan mode, delaying a scan signal in the scan path by propagating the scan signal through a plurality of delay devices coupled in series, wherein a first one of the delay devices is powered by a first voltage, a second one of the delay devices is powered by a second voltage, and the second voltage is greater than the first voltage; and in a functional mode, disabling the delay devices.

2. The method of claim 1, wherein the second voltage is at least 0.01 volts greater than the first voltage.

3. The method of claim 1, wherein disabling the delay devices comprises holding an output of the first one of the delay devices at a constant logic state.

4. The method of claim 3, wherein the first one of the delay devices is also powered by the second voltage, and the constant logic state corresponds to a voltage approximately equal to the second voltage.

5. The method of claim 1, further comprising generating the first voltage from the second voltage using a diode-connected transistor.

6. The method of claim 5, wherein the first voltage is approximately equal to the second voltage minus a voltage across the diode-connected transistor.

7. The method of claim 1, wherein the delay devices are coupled between an output of a first latch and an input of a second latch.

8. The method of claim 7, further comprising:
inputting the scan signal to an input of the first latch in the scan mode; and
inputting a data signal to the input of the first latch in the functional mode.

9. The method of claim 1, wherein the first one of the delay devices comprises a NAND gate having a first input and a second input, the scan signal is input to the first input of the NAND gate in the scan mode, and disabling the delay devices in the functional mode comprises inputting a logic zero to the second input of the NAND gate.

10. The method of claim 1, wherein the first one of the delay devices comprises a NOR gate having a first input and a second input, the scan signal is input to the first input of the NOR gate in the scan mode, and disabling the delay devices in the functional mode comprises inputting a logic one to the second input of the NOR gate.

11. The method of claim 1, wherein, in the scan mode, the first one of the delay devices has an output voltage swing approximately equal to the first voltage, and the second one of the delay devices has an output voltage swing approximately equal to the second voltage.

12. The method of claim 11, wherein a third one of the delay devices coupled between the first and second ones of the delay devices outputs a logic zero to an input of the second one of the delay devices in the functional mode.

13. The method of claim 1, wherein the first voltage is applied across the first one of the delay devices to power the first one of the delay devices, and the second voltage is applied across the second one of the delay devices to power the second one of the delay devices.

14. An apparatus for signal delay in a scan path, comprising:
means for, in a scan mode, delaying a scan signal in the scan path by propagating the scan signal through a plurality of delay devices coupled in series, wherein a first one of the delay devices is powered by a first voltage, a second one of the delay devices is powered by a second voltage, and the second voltage is greater than the first voltage; and
means for, in a functional mode, disabling the delay devices.

15. The apparatus of claim 14, wherein the second voltage is at least 0.01 volts greater than the first voltage.

16. The apparatus of claim 14, wherein the means for disabling the delay devices comprises means for holding an output of the first one of the delay devices at a constant logic state.

17. The apparatus of claim 16, wherein the first one of the delay devices is also powered by the second voltage, and the constant logic state corresponds to a voltage approximately equal to the second voltage.

18. The apparatus of claim 14, further comprising means for generating the first voltage from the second voltage.

19. The apparatus of claim 14, wherein the delay devices are coupled between an output of a first latch and an input of a second latch.

20. The apparatus of claim 19, further comprising:
means for inputting the scan signal to an input of the first latch in the scan mode; and
means for inputting a data signal to the input of the first latch in the functional mode.

21. The apparatus of claim 14, wherein the first one of the delay devices comprises a NAND gate having a first input and a second input, the scan signal is input to the first input of the NAND gate in the scan mode, and the means for disabling the delay devices in the functional mode comprises means for inputting a logic zero to the second input of the NAND gate.

22. The apparatus of claim 14, wherein the first one of the delay devices comprises a NOR gate having a first input and a second input, the scan signal is input to the first input of the NOR gate in the scan mode, and disabling the delay devices in the functional mode comprises inputting a logic one to the second input of the NOR gate.

23. The apparatus of claim 14, wherein, in the scan mode, the first one of the delay devices has an output voltage swing approximately equal to the first voltage, and the second one of the delay devices has an output voltage swing approximately equal to the second voltage.

24. The apparatus of claim 23, wherein a third one of the delay devices coupled between the first and second ones of the delay devices outputs a logic zero to an input of the second one of the delay devices in the functional mode.

25. The apparatus of claim 14, wherein the first voltage is applied across the first one of the delay devices to power the first one of the delay devices, and the second voltage is applied across the second one of the delay devices to power the second one of the delay devices.

26. A delay circuit, comprising:
a first delay device having a first input, a second input, and an output, wherein the first delay device is powered by a first voltage;
a second delay device having an input coupled to the output of the first delay device, and an output, wherein the second delay device is powered by the first voltage; and
a third delay device having an input coupled to the output of the second delay device, and an output, wherein the third delay device is powered by a second voltage;
wherein the second voltage is greater than the first voltage, and wherein the first, second and third delay devices are configured to propagate a scan signal from the first input of the first delay device to the output of the third delay device if a first logic state is input to the second input of the first delay device, and to block a signal from propagating through the first, second and third delay devices if a second logic state is input to the second input of the first delay device.

27. The delay circuit of claim 26, wherein the second voltage is at least 0.01 volts greater than the first voltage.

28. The delay circuit of claim 26, wherein the first delay device is also powered by the second voltage, and the first delay device is configured to output a voltage approximately equal to the second voltage if the second logic state is input to the second input of the first delay device.

29. The delay circuit of claim 28, wherein the first delay device has an output voltage swing approximately equal to the first voltage if the first logic state is input to the second input of the first delay device.

30. The delay circuit of claim 26, wherein the first delay device has an output voltage swing approximately equal to the first voltage if the first logic state is input to the second input of the first delay device.

31. The delay circuit of claim 26, further comprising: a voltage supply rail; and
 a diode-connected transistor coupled between the second voltage and the voltage supply rail, wherein the diode-connected transistor is configured to generate the first voltage on the voltage supply rail.

32. The delay circuit of claim 26, wherein the first input of the first delay circuit is coupled to an output of a first latch, and the output of the third delay circuit is coupled to an input of a second latch.

33. The delay circuit of claim 26, wherein the first delay device comprises a NAND gate, the first logic state is a logic one, and the second logic state is a logic zero.

34. The delay circuit of claim 26, wherein the first delay device comprises a NOR gate, the first logic state is a logic zero, and the second logic state is a logic one.

35. The delay circuit of claim 26, wherein the second delay device has an output voltage swing approximately equal to the first voltage.

36. The delay circuit of claim 26, wherein the first voltage is applied across the first delay device to power the first delay device, and the second voltage is applied across the third delay device to power the third delay device.

* * * * *